(12) United States Patent
Chan et al.

(10) Patent No.: US 7,873,891 B2
(45) Date of Patent: Jan. 18, 2011

(54) PROGRAMMABLE VOLTAGE DIVIDER

(75) Inventors: Yuen H. Chan, Poughkeepsie, NY (US); Rajiv V. Joshi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 262 days.

(21) Appl. No.: 12/114,853

(22) Filed: May 5, 2008

(65) Prior Publication Data

US 2008/0203980 A1 Aug. 28, 2008

Related U.S. Application Data

(62) Division of application No. 11/028,174, filed on Jan. 3, 2005, now Pat. No. 7,447,964.

(51) Int. Cl.
G01R 31/28 (2006.01)
G06F 11/00 (2006.01)

(52) U.S. Cl. ............. 714/735; 714/734; 324/537; 324/522; 324/527; 365/201

(58) Field of Classification Search ............. None
See application file for complete search history.

(56) References Cited

U.S. PATENT DOCUMENTS

| | | | |
|---|---|---|---|
| 4,613,957 A | 9/1986 | Iwahashi | |
| 4,814,638 A | 3/1989 | Weick | |
| 5,225,772 A | 7/1993 | Cheung et al. | |
| 5,461,310 A | 10/1995 | Cheung et al. | |
| 5,490,107 A | 2/1996 | Akaogi et al. | |
| 5,504,447 A | 4/1996 | Egging | |
| 5,521,493 A | 5/1996 | Persons | |
| 5,801,985 A | 9/1998 | Roohparvar et al. | |
| 5,831,903 A | 11/1998 | Ohuchi et al. | |
| 5,886,552 A | 3/1999 | Chai et al. | |
| 6,051,979 A | 4/2000 | Chandler et al. | |
| 6,081,454 A | 6/2000 | Ohuchi et al. | |
| 6,088,819 A | 7/2000 | Adachi et al. | |
| 6,118,703 A | 9/2000 | Hamaguchi | |
| 6,157,200 A | 12/2000 | Okayasu | |
| 6,255,862 B1 | 7/2001 | Kumagai et al. | |
| 6,330,697 B1 | 12/2001 | Clinton et al. | |
| 6,757,228 B2 | 6/2004 | Kuroda | |
| 6,888,765 B1 | 5/2005 | Kotowski et al. | |
| 6,950,971 B2 | 9/2005 | Boehler et al. | |
| 2002/0104048 A1 | 8/2002 | Frank et al. | |
| 2003/0012068 A1 | 1/2003 | Satani et al. | |
| 2004/0105299 A1 | 6/2004 | Joshi | |
| 2004/0153783 A1 | 8/2004 | Yusa | |

*Primary Examiner*—Jeffrey A Gaffin
*Assistant Examiner*—Guerrier Merant
(74) *Attorney, Agent, or Firm*—Law Office of Charles W. Peterson, Jr.; Brian P. Verminski, Esq.

(57) ABSTRACT

A test circuit and programmable voltage divider that may be used in the test circuit. The programmable voltage divider develops a voltage difference signal that may be digitally selected. The test circuit may be used to test and characterize sense amplifiers. The programmable voltage divider develops a signal with a selected polarity and magnitude that is provided to a sense amplifier being tested. The sense amplifier is set and its output latched. The latch contents are checked against an expected value. The difference voltage may be changed and the path retested to find passing and failing points.

7 Claims, 5 Drawing Sheets

PROGRAMMABLE VOLTAGE DIVIDER

CROSS REFERENCE TO RELATED APPLICATION

The present invention is a divisional of U.S. patent application Ser. No. 11/028,174, now U.S. Pat. No. 7,447,964, "DIFFERENCE SIGNAL PATH TEST AND CHARACTERIZATION CIRCUIT" to Yuen H. Chan et al., filed Jan. 3, 2005, assigned to the assignee of the present invention and incorporated herein by reference.

FIELD OF THE INVENTION

The present invention is related to small signal circuit design and more particularly to testing, characterizing and evaluating circuit sensitivity to a difference signal.

BACKGROUND DESCRIPTION

Integrated circuits (ICs) are commonly made in the well-known complementary insulated gate field effect transistor (FET) technology known as CMOS. CMOS technology and chip manufacturing advances have resulted in a steady decrease of chip feature size to increase on-chip circuit switching frequency (circuit performance) and the number of transistors (circuit density). In what is typically referred to as scaling, device or FET features are shrunk to shrink corresponding device minimum dimensions including both horizontal dimensions (e.g., minimum channel length) and vertical dimensions, e.g., channel layer depth, gate dielectric thickness, junction depths and etc. Shrinking device size increases device density and device performance, as well as reduces device-operating conditions, i.e., chip and correspondingly, device supply voltages and voltage swings. Consequently, as a result of scaling otherwise seemingly neglectable device-to-device variations (e.g., length, width, threshold and etc.) have caused serious design problems, especially in signal critical circuits such as memory sense amplifiers.

A typical CMOS circuit includes paired complementary devices, i.e., an n-type FET (NFET) paired with a corresponding p-type FET (PFET), usually gated by the same signal. Since the pair of devices have operating characteristics that are, essentially, opposite each other, when one device (e.g., the NFET) is on and conducting (ideally modeled as a closed switch), the other device (the PFET) is off, not conducting (ideally modeled as an open switch) and, vice versa. So, for example, a CMOS inverter is a series connected PFET and NFET pair that are connected between a power supply voltage (Vdd) and ground (GND).

An ideal static random access memory (SRAM) cell includes a balanced pair of cross-coupled inverters storing a single data bit with a high at the output of one inverter and a low at the output of the other. A pair of pass gates (also ideally, a balanced pair of FETs) selectively connects the complementary outputs of the cross-coupled inverter to a corresponding complementary pair of bit lines. A word line connected to the gates of the pass gate FETs selects the cell, connecting the cell contents to the corresponding complementary pair of bit lines. During a read, each cell on the selected word line couples its contents to its corresponding bit line pair through NFET pass gates. Since the bit line pair is typically pre-charged to some common voltage, initially, the internal (to the cell) low voltage rises until one of the bit line pairs droops sufficiently to develop a small difference signal (e.g., 30 mV). A simple ideal sense amplifier or, sense amp, is a matched pair of cross-coupled common-source devices connected between a bit line pair and an enable source line. Device imbalances in matched cell devices or the matched sense amp pair can unbalance the pair to seriously erode the sense signal margin and even cause sense amplifier errors.

Leakage currents can cause an inadequately balanced sense amplifier to self-trigger. Leakage from high floating-device body-voltages may cause large offset voltages scattered unevenly in SOI devices that may trigger the sense amplifier prematurely, latching false data. Similarly, SRAM cells can become instable from such leakage and cell performance may degrade. Robust sensing techniques have been developed to subside to deal with device variability. However, evaluating such a sensing technique requires providing a variable differential signal that may be slewed within a range of interest. This may be done for an entire SRAM data path (e.g., macro or chip), for example, by varying array/cell supply voltage and determining read and write failing points. Unfortunately, this only gives an overall figure of merit for the data path. Because circuits such as sense amps, of necessity, are very sensitive, it is not particularly helpful in evaluating such robust sensing circuits. It has been especially difficult to evaluate circuit response to a small voltage differential in such a sense circuit isolated from SRAM cells, i.e., outside of a data path. Consequently, it is difficult to characterize and evaluate state of the art SRAM cell sensing circuits.

Thus, there is a need for circuit that reliably test and characterize SRAM cell sensing circuits and especially for simple and in-line test and characterization circuits that test small signal circuits to assist in deciding the merit of new sensing circuits.

SUMMARY OF THE INVENTION

It is a purpose of the invention to derive meaningful test results from testing isolated sense amplifiers;

It is another purpose of the invention to characterize and compare sense amplifier designs;

It is yet another purpose of the invention to programmably generate a difference signal;

It is yet another purpose of the invention to provide a programmable difference signal to sense amplifiers for determining a sense amplifier sense point and characterizing the sense amp.

The present invention relates to a test circuit and programmable voltage divider that may be used in the test circuit. The programmable voltage divider develops a voltage difference signal that may be digitally selected. The test circuit may be used to test and characterize sense amplifiers. The programmable voltage divider develops a signal with a selected polarity and magnitude that is provided to a sense amplifier being tested. The sense amplifier is set and its output latched. The latch contents are checked against an expected value. The difference voltage may be changed and the path retested to find passing and failing points.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
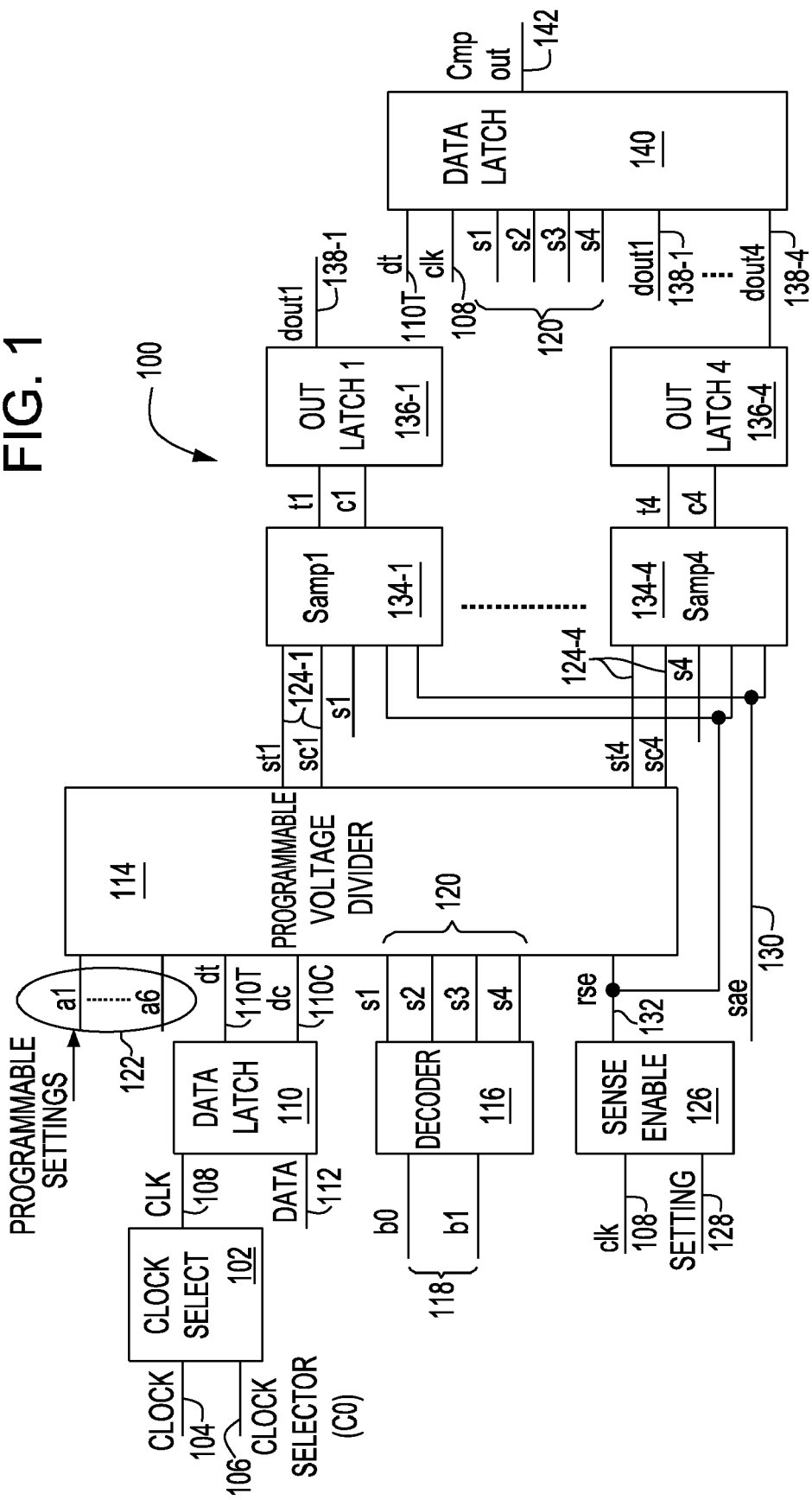
FIG. 1 shows a block diagram example of a preferred embodiment signal margin characterization and test circuit.

Turning now to the drawings and, more particularly, FIG. 1 shows a block diagram example of a preferred embodiment signal margin characterization and test circuit 100. Preferably, the signal margin characterization and test circuit 100 is formed in the complementary insulated gate field effect transistor (FET) technology known as CMOS. A clock select circuit 102 receives a global clock 104 and a clock select signal 106 and, when selected, provides a local clock 108 to an input data latch 110. The input data latch 110 receives a data input value 112 (a "1" or a "0") and provides a complementary output pair 110T, 110C as an input to a preferred voltage divider circuit 114, described in further detail hereinbelow. A 2:4 decoder 116 decodes a circuit test (e.g., sense amp) select 118 and provides a decoded sense amp select 120 to the preferred voltage divider circuit 114. Voltage difference select signals 122 to the preferred voltage divider circuit 114 select a voltage difference that is provided on one pair of difference signal outputs 124-1-124-4, as selected by the decoded sense amp select 120. A sense enable circuit 126 receives a sense select signal 128 and selectively gates the local clock 108 to generate a sense amp enable (sae) 130 and sense amp reset or reset enable (rse) 132. The difference signal outputs 124-1-124-4 are inputs to corresponding sense amplifiers 134-1-134-4. The sense amp enable 130 in combination with a corresponding one of decoded sense amp select 120 selects one of sense amplifiers 134-1-134-4. Each sense amplifier 134-1-134-4 provides a complementary output to a corresponding output data latch 136-1-136-4. The output data latches 136-1-136-4 provide a latched data output 138-1-138-4 to a comparator 140, also described in further detail hereinbelow. The comparator 140 compares the contents of the output data latch 136-1-136-4 for the selected sense amplifier 134-1-134-4 against the contents of the input data latch 110 (at 110T) and provides an indication of a match at output 142.

So, with the clock select signal 106 asserted, the global clock 104 is passed to the local clock 108, clocking data 112 in the input data latch 110 and selectively clocking the sense enable 126. The preferred voltage divider circuit 114 receives the latched complementary data pair 110T, 110C. In response to the reset enable 132 from sense enable 126, the preferred voltage divider circuit 114 generates a difference signal with polarity determined by data latch 110 contents. The magnitude of the difference is selected by the voltage difference select signals 122. The difference signal is selectively passed out on a selected output 124-1-124-4, selected by the decoded sense amp select 120. In response to the sense amp enable 130 the selected sense amp 134-1-134-4 senses (or fails to sense) the difference on the selected 124-1-124-4. The sensed value in the selected sense amp 134-1-134-4 is latched in a respective one of the output data latches 136-1-136-4. The sensed results (from the output data latches 136-1-136-4) is compared against the expected result, i.e., from the input data latch 110. Thus, by shifting or stepping the voltage difference from the preferred voltage divider circuit 114, the sense amplifiers 134-1-134-4 receive a selectively varied signal that characterizes the sense amp response, e.g., indicates sense margin and a minimum sense signal may be determined. It should be noted that although described in terms of selecting one of 4 sense amps for test and/or characterization, the present invention has application to testing and characterizing any number of any type of circuit receiving a difference signal.

Figure 2:
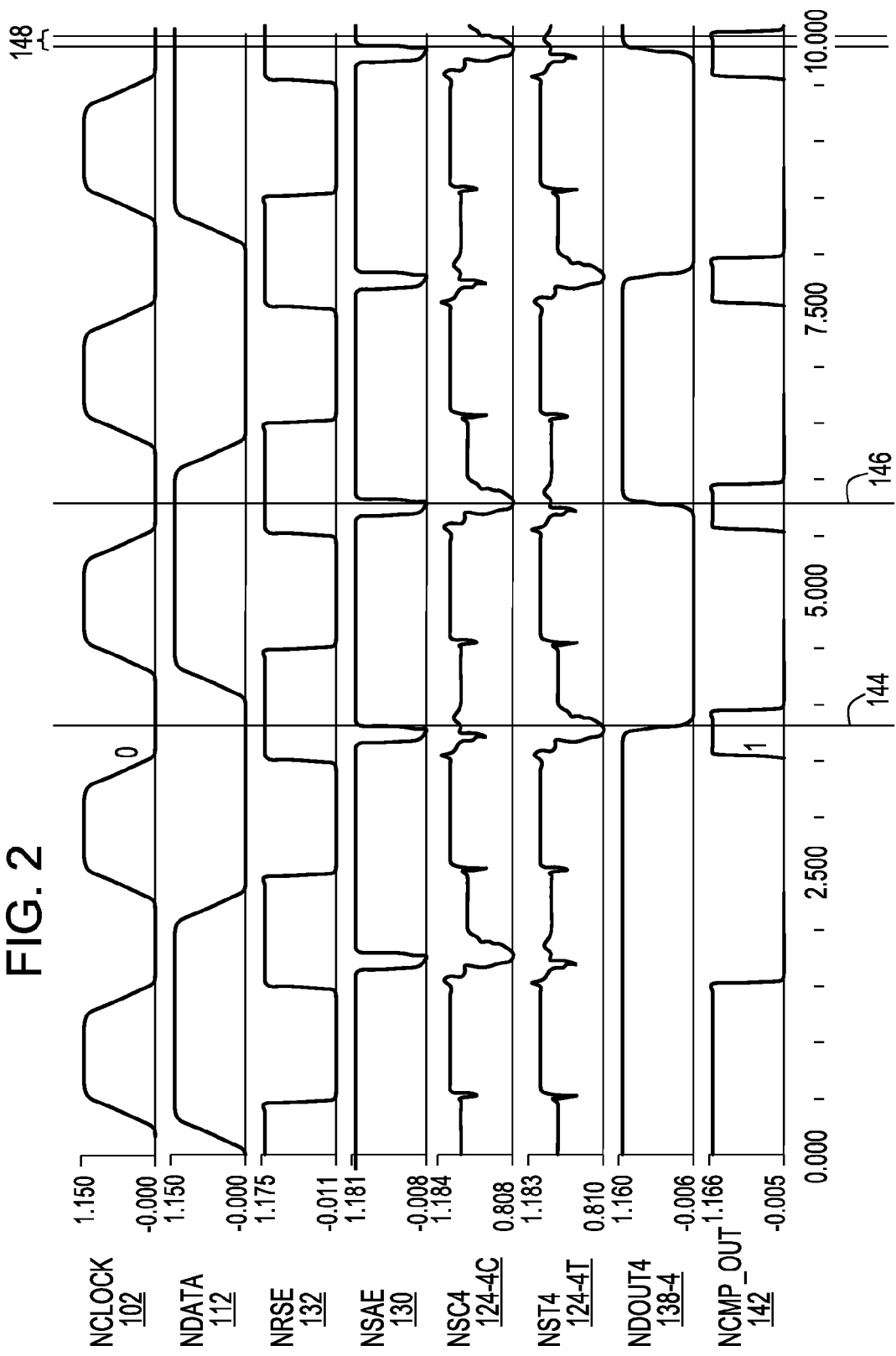
FIG. 2 shows a timing example of a typical compare for the signal margin characterization and test circuit, comparing data in as a zero and a one.

FIG. 2 shows an example of typical compare timing for the signal margin characterization and test circuit 100 of the example of FIG. 1, for both values of data—in 112, as a zero 144 and a one 146. In this example, the clock select signal 106 and the sense select signal 128 are held asserted to pass the global clock 104 and local clock 108 through the clock select circuit 102 and sense enable circuit 126, respectively. Also in this example, both the sense amp enable 130 and reset enable 132 are asserted low, i.e., the sense amplifiers 134-1-134-4 are enabled by a low on the sense amp enable 130 and reset by a low on the reset enable 132. So, in this example, the voltage difference select signals 122 to the preferred voltage divider circuit 114 are selected to develop a signal at the difference signal pair 124-4T, 124-4C that is approximately 20 millivolts (20 mV), with 0.10V for the high and 0.08V for the low, respectively. Also in this example, the difference signal pair 124-4T, 124-4C recovers 148 relatively quickly.

Figure 3:
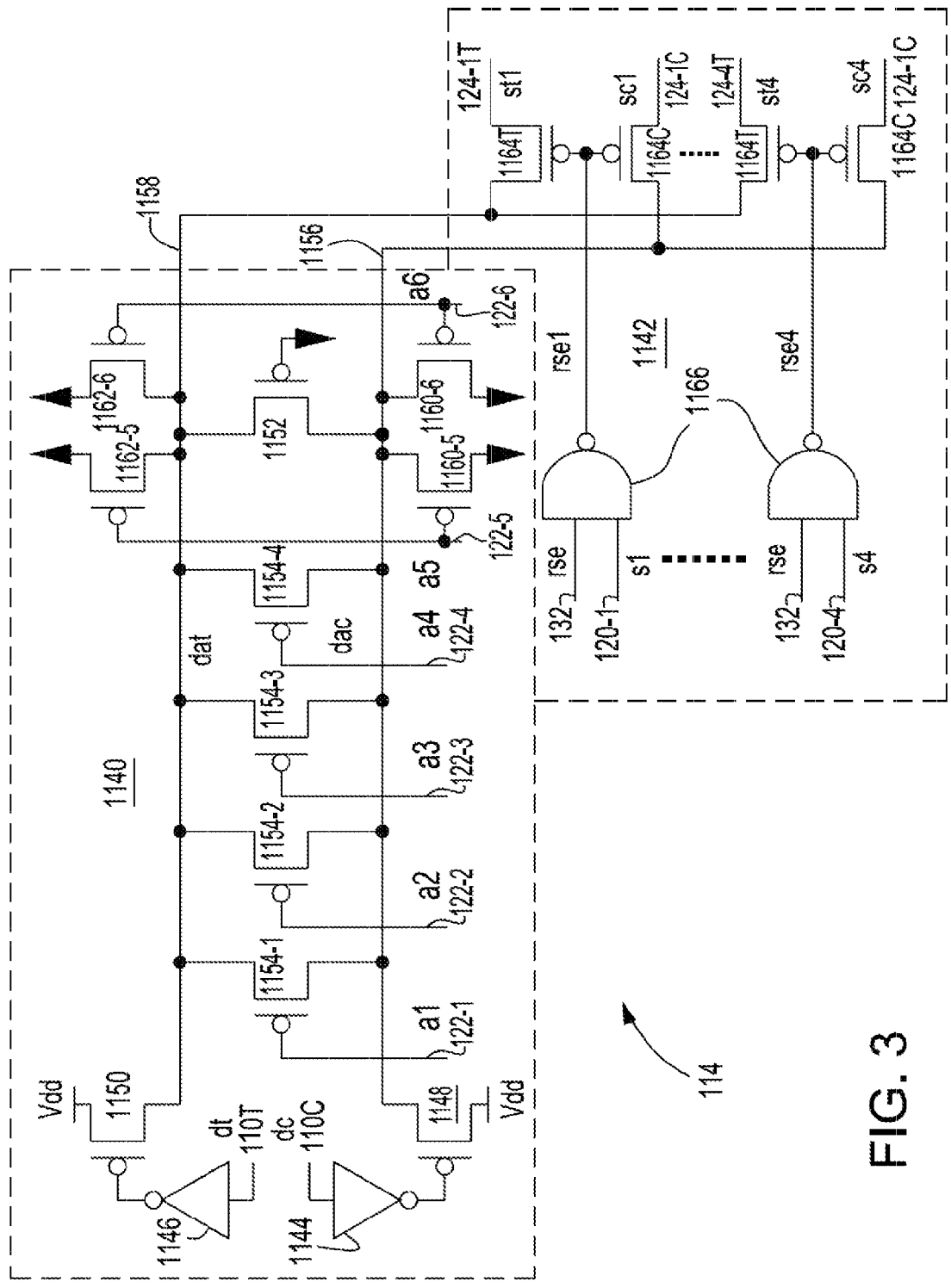
FIG. 3 shows an example a preferred programmable voltage divider.

FIG. 3 shows an example a preferred voltage divider circuit 114 in more detail, which in this example is a programmable voltage divider. A difference signal is developed in an active resistor network 1140 and selectively passed to a 1 of 4 select 1142. The complementary input data pair 110T, 110C are provided to inverters 1144, 1146. Inverters 1144, 1146 gate a supply transistor 1148, 1150, a p-type (PFET) in this example. Parallel PFETs 1152, 1154-1, 1154-2, 1154-3, 1154-4, are connected between the drains of supply PFETs 1148, 1150 at a switched difference signal pair 1156, 1158. The source of each supply PFET 1148, 1150 is connected to a supply voltage. Parallel PFETs 1154-1, 1154-2, 1154-3, 1154-4, are gated by a respective one of the voltage difference select signals 122-1, 122-2, 122-3, 122-4 and PFET 1152 is tied on, i.e., grounded gate. The remaining voltage difference select signals 122-5, 122-6 each gate a pair of supply return transistors 1160-5, 1162-5 and 1160-6, 1162-6, respectively. The sources of supply return transistors 1160-5, 1160-6 are connected between ground and one of the switched difference signal pair 1156. Similarly, supply return transistors 1162-5, 1162-6 are connected between ground and the other of the switched difference signal pair 1158. The 1 of 4 select 1142 includes 4 pair of pass gates (e.g., 1164T, 1164C) gated by a NAND gate 1166. The reset enable 132 is an input to each NAND gate 1166, which selectively passes a corresponding sense amp select signal 120-1-120-4 to select one of the 4 pair of pass gates 1164T, 1164C. Each pair of pass gates 1164T, 1166C selectively couples the difference voltage on the switched difference signal pair 1156, 1158 to one of the difference signal output pairs 124-1-124-4. A body contact may be provided to each individual PFET 1148, 1150, 1152, 1154-1, 1154-2, 1154-3, 1154-4, 1160-5, 1162-5, 1160-6, 1162-6, 1164T, 1164C, to any combination thereof (e.g., shared contacts to one or more) or forgone completely, i.e., one or more or all floating body PFETs as desired.

With all of the voltage difference select signals 122-1, 122-2, 122-3, 122-4, 122-5 and 122-6 high, the active resistor network 1140 is switched off. Since PFET 1152 is gated on, the switched difference signal pair 1156, 1158 are effectively shorted together through 1152. So, regardless of the contents of input data latch 110, one of the complementary data pair 110T, 110C, one is low (e.g., 110C) and the other (110T) is high. In response to the low input, the output of the corresponding inverter 1144 is high, turning off the respective PFET 1148; and, in response to the high on the other input, the output of corresponding inverter 1146 is low, turning on the respective PFET 1150. However, since the switched difference signal pair 1156, 1158 are effectively shorted together and there is no current path to ground, both are high. If one pair of pass gates 1164T, 1164C is selected, the high is passed on both output lines, e.g., 124-4T, 124-4C.

Figure 4:
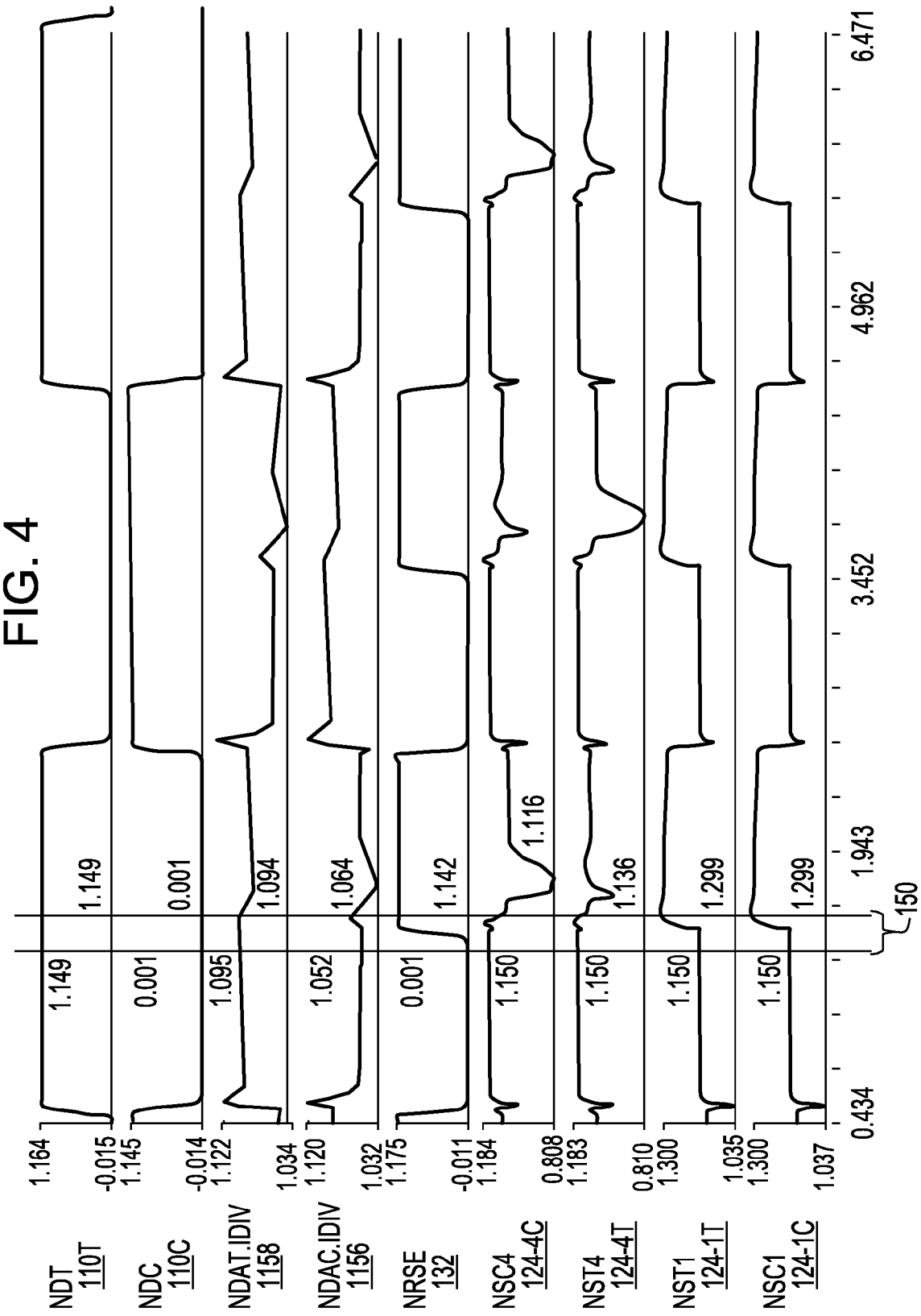
FIG. 4 shows a timing example of a typical difference signal generation for the voltage divider circuit.

FIG. 4 shows a timing example of a typical difference signal generation for the voltage divider circuit 114 of the example of FIG. 3. In this example, the data in is switched on each cycle as is reflected by the state change of the complementary data pair 110T, 110C with each reset enable 132 cycle. As in the example of FIG. 2, sense amps are enabled (not shown in this figure) when the reset enable 132 is high. Thus, in time window 150 a difference signal develops on the selected both output lines, e.g., 124-4T, 124-4C. Coupling noise is shown on the unselected output pair 124-1T, 124-1C, which are both floating to allow the unselected sense amplifier (e.g., 134-1 in FIG. 1) to capacitively couple the reset enable signal 132 back onto the floating pair 124-1T, 124-1C. However, since the respective sense amplifier is unselected, this noise is ignored.

However, if either or both of 122-5 and 122-6 are low, either or both of supply return transistors 1160-5, 1162-5 and 1160-6, 1162-6, respectively, provide a path to ground at both of the switched difference signal pair 1156, 1158. Thus, with either or both of 122-5 and 122-6 low, the series connected PFETs act as a voltage divider. So, in the example with 110C low and 110T high, PFET 1150 and PFET 1162-5 (and/or 1162-6) provide one path to ground; and, series connected PFET 1152 and PFET 1160-5 (and/or 1160-6) provide a parallel partial path (to and through 1162-5 and/or 1162-6) to ground. Further, if any of the voltage difference select signals 122-1, 122-2, 122-3, 122-4 are low, corresponding ones of parallel PFETs 1154-1, 1154-2, 1154-3, 1154-4 are on reducing the path resistance of PFET 1152 and correspondingly, the difference signal. Thus, a difference voltage develops depending upon devices sizes of the on-PFETs as selected by the voltage difference select signals 122-1, 122-2, 122-3, 122-4, 122-5 and 122-6. Whatever difference is selected, however, is passed to the selected pair of pass gates 1164T, 1164C to the output lines, e.g., 124-4T, 124-4C.

Figure 5:
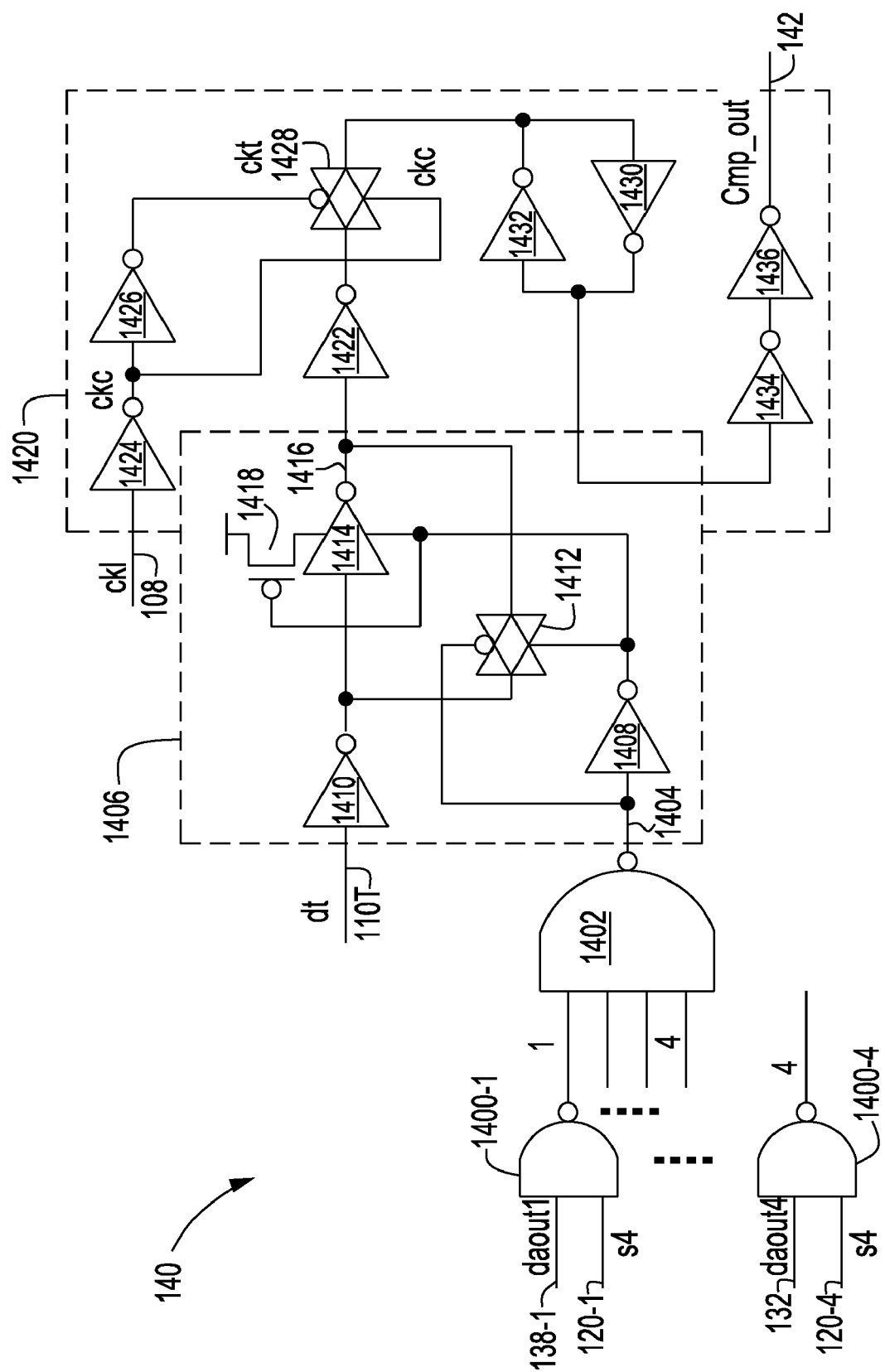
FIG. 5 shows an example of a preferred comparator.

FIG. 5 shows an example of a preferred comparator 140. The contents of the output data latch 136-1-136-4 are provided to a 4:1 encoder that includes 4 two input NAND gates 1400-1-1400-4 and four input NAND gate 1402. Each of the 4 two input NAND gates 1400-1-1400-4 combines one the output of one data latch 136-1-136-4 with a corresponding sense amp select signal 120-1-120-4. NAND gate 1402 combines the outputs of the 4 two input NAND gates 1400-1-1400-4. The output 1404 of the 4:1 encoder from NAND gate 1402 is compared against the input data 110T in a compare circuit 1406 that, in this example includes inverters 1408, 1410, and two tri-statable buffers 1412, 1414. Inverter 1408 inverts the encoder output 1404 and inverter 1410 inverts the input data 110T. Tri-statable buffer 1412 is a non-inverting buffer and tri-statable buffer 1414 is an inverting totem driver buffer. So, when totem driver 1414 is driving the output 1416, PFET 1418 supplies totem power and inverter 1408 supplies totem ground; otherwise, the totem driver 1414 is in its high impedance state. The output 1416 of the compare 1406 is latched in a clocked output latch 1420, clocked by the local clock 108. An inverter 1422 buffers the output 1416 of the compare 1406. The local clock 108 is passes through a pair series connected inverters 1424, 1426 which provide complementary enable signals to non-inverting tri-statable buffer 1428 at the output of inverter 1422. A pair of cross coupled inverters 1430, 1432 latch the other side of non-inverting tri-statable buffer 1428. A pair of series inverters 1434, 1436 buffer the cross coupled inverters 1430, 1432 and provide the compare output 142.

So, the outputs of the two input NAND gates 1400-1, . . . , 1400-4 are high unless the data output 138-1-138-4 from the selected output data latch 136-1-136-4 is high, i.e., both the asserted sense amp select signal 120-1-120-4 and the corresponding data output 138-1-138-4 are high. If all of the outputs of the two input NAND gates 1400-1, . . . , 1400-4 are high, the output of NAND gate 1402 is low (indicating a sensed zero) and the output of inverter 1408 is high. Non-inverting tri-statable buffer 1412 is on and totem driver 1414 is off (hi-Z). If, however, one output of a respective two input NAND gate 1400-1, . . . , 1400-4 is low, because the asserted sense amp select signal 120-1-120-4 and the corresponding data output 138-1-138-4 are both high, then the output of NAND gate 1402 is high (indicating a sensed one) and the output of inverter 1408 is low. Non-inverting tri-statable buffer 1412 is off (hi-Z) and totem driver 1414 is on.

If the input data 110T matches the output of NAND gate 1402, the selected sense amp has sensed the difference signal correctly. So, if a one is sensed correctly, the output of inverter 1410 is low. The totem driver 1414 inverts the low so that the compare output 1416 is high. If a zero is sensed correctly, the output of inverter 1410 is high. The non-inverting tri-statable buffer 1412 passes the high so that, again, the compare output 1416 is high. However, if a one is sensed incorrectly, the output of inverter 1410 is high and the totem driver 1414 inverts the high, providing a low at the compare output 1416. Likewise, if a zero is sensed incorrectly, the output of inverter 1410 is low and the non-inverting tri-statable buffer 1412 passes the low to the compare output 1416.

Buffer inverter 1422 inverts the compare output 1416. The inverted compare signal passes through non-inverting tri-statable buffer 1428 when the local clock 108 is low and remains latched in cross coupled inverters 1430, 1432 when the clock rises. The inverting latch output from inverter 1430 re-inverts the compare results. The re-inverted results pass through the pair of series inverters 1434, 1436, emerging as a match indication at the compare output 142.

Advantageously, a preferred embodiment circuit develops difference (analog) signals that may be used independent of SRAM cells as test signals to test and characterize circuits, e.g., sense amplifiers. The test signals may be generated and controlled digitally; the circuit under test (e.g., a sense amp) tested; and test results reported in a digital output. Further, the same difference signal may be applied to various sense amplifier topologies or designs for a realistic in situ circuit comparison.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A programmable voltage divider comprising:
   a complementary data input selecting a difference signal polarity;
   a programmable resistor developing a difference voltage having the selected said difference signal polarity, wherein said programmable resistor comprises a p-type field effect transistor (PFET) resistor network, said programmable resistor further comprising:
   a pair of inverters each receiving one said complementary data input, a pair of supply PFETs mutually exclusively supplying power to said PFET resistor network, each connected between a supply and one of a pair of difference signal lines, an output of each of said pair of inverters being connected to a gate of a corresponding one of said pair of supply PFETs; and a selectable output selectively providing a difference voltage as a difference signal output.

2. A programmable voltage divider as in claim 1, wherein said programmable resistor further comprises a plurality of selectively-gated parallel-connected said PFETs connected between said pair of difference signal lines.

3. A programmable voltage divider as in claim 2, wherein said programmable resistor further comprises a plurality of selectively-gated series-connected supply return said PFETs connected between a supply return and one of said pair of difference signal lines.

4. A programmable voltage divider as in claim 3, wherein said programmable resistor further comprises a tied-on PFET in parallel with said selectively-gated parallel-connected PFETs; and, wherein each of said selectively-gated parallel-connected PFETs and each pair of said selectively-gated series-connected supply return PFETs are connected to a corresponding one of a plurality of resistance programming selects, a first PFET of said each pair being connected between one of said pair of difference signal lines and a supply return, and a second PFET of said each pair being connected between the other of said pair of difference signal lines and said supply return.

5. A programmable voltage divider as in claim 4, wherein said selectable output select comprises a plurality of pairs of pass gates, each connected between said pair of difference signal lines and a corresponding difference signal output.

6. A programmable voltage divider as in claim 5, wherein said pass gates are PFETs.

7. A programmable voltage divider as in claim 6, wherein one or more PFETs are floating body PFETs.

* * * * *